United States Patent [19]

Shiga et al.

[11] Patent Number: 5,194,419
[45] Date of Patent: Mar. 16, 1993

[54] METHOD FOR MANUFACTURING AN OXIDE SUPERCONDUCTIVE MULTILAYER CIRCUIT

[75] Inventors: Shoji Shiga; Nakahiro Harada; Kiyoshi Yamamoto; Koki Sato, all of Tokyo, Japan

[73] Assignee: The Furukawa Electric Co., Ltd., Tokyo, Japan

[21] Appl. No.: 555,061

[22] Filed: Jul. 18, 1990

[30] Foreign Application Priority Data

Jul. 25, 1989 [JP] Japan .................................. 1-191956

[51] Int. Cl.$^5$ ......................... B05D 5/12; B05D 3/06; H01L 39/24
[52] U.S. Cl. ....................................... 505/1; 505/701; 505/702; 505/703; 505/730; 505/731; 505/732; 505/742; 427/62; 427/63; 427/516; 257/31
[58] Field of Search ................. 427/62, 63, 38; 505/1, 505/701, 702, 703, 730, 742, 731, 732; 357/5

[56] References Cited

U.S. PATENT DOCUMENTS

| 4,900,716 | 2/1990 | Fujita et al. | 505/1 |
| 5,051,396 | 9/1991 | Yamazaki | 505/1 |

FOREIGN PATENT DOCUMENTS

| 0282360A2 | 9/1988 | European Pat. Off. |
| 0286106A2 | 10/1988 | European Pat. Off. |
| 0296973 | 12/1988 | European Pat. Off. |
| 0358879 | 3/1990 | European Pat. Off. |
| 1-43916 | 2/1989 | Japan ................ 505/742 |
| 1-250880 | 2/1989 | Japan . |

OTHER PUBLICATIONS

Yoshida et al, "Oxygen Diffusion into Oxygen-Deficient $Ba_2YCu_3O_{7-x}$ Films During Plasma Oxidation", Appl. Phys. Lett. 53(9), Aug. 1988, pp. 811-813.
Boerstler et al., "Non-Aqueous One-Micron Feature Size Lithography of Superconducting Films", Thin Film Supercond., Meeting Date 1988, pp. 469-479. Edited by R. McConnell et al Plenum Press, New York, 1989.
Koch et al, MRS Extended Abs., Apr. 23-24, 1987, pp. 82-84.
Clark et al, App. Phys. Lett, vol. 51, No. 2, Jul. 13, 1987, pp. 139-141.
Applied Physics Letters, vol. 55, No. 9, Aug. 28, 1989, pp. 896-890; Q. Y. Ma et al: "Novel method of patterning YBaCuO superconducting films".
Japanese Journal of Applied Physics, vol. 29, No. 6, Jun. 1990, pp. 1076-1079, T. Hatano et al, "Unique method of patterning superconducting thin films by selective growth of Y—Ba—Cu—O".
Proceedings of Symposium S. Extended Abstracts of High Tc Superconductors, Spring Meeting of the Materials Research Society, Apr. 1987, pp. 81-84; R. H. Koch et al.: "Thin Films and Squids made from YBa2-Cu3Oy".
Report of Japan Institute of Metal, vol. 26, No. 10, pp. 980, 982 and 982, Oct. 1987.
K. Kitazawa, "Problems of Oxide Superconductors-Discussions on Critical Current", Report of Japan Institute of Applied Electromagnetics, vol. 12, No. 5, pp. 564 and 565, May 1988.

Primary Examiner—Shrive Beck
Assistant Examiner—Roy V. King
Attorney, Agent, or Firm—Frishauf, Holtz, Goodman & Woodward

[57] ABSTRACT

A method for manufacturing a superconductive multilayer circuit has a first thin film forming step for forming a thin film, which is composed of superconductive material or a similar material thereto, on a substrate, a first circuit layer forming step for forming a superconductive circuit by discharging a specific component from a predetermined part of the thin film or implanting the component in the thin film, a second thin film forming step for forming a thin film, which is composed of a superconducting material or the simulant thereto, on the first circuit layer, and a second circuit layer forming step for forming a superconductive circuit by removing a specific component from a predetermined part of the thin film or implanting the component in the thin film.

13 Claims, 2 Drawing Sheets

METHOD FOR MANUFACTURING AN OXIDE SUPERCONDUCTIVE MULTILAYER CIRCUIT

BACKGROUND OF THE INVENTION

1. Field of the Invention

The present invention relates to a multilayer circuit having a conductor made up of a superconductive material, and its manufacturing method.

2. Description of the Related Art

Conventionally, multilayer circuits, which are used in electronic equipment, are formed by use of normal conductive materials or semiconductor materials. In the process of manufacturing the multilayer circuits, the formation of a conductive film, coating of a resist, exposure, and etching are performed. However, according to this method, since a non-circuit part is removed by etching, a circuit part is formed to be projected. In a case where the multilayer circuits are formed by this method, the circuit part is formed and an insulating material is embedded in the removed non-circuit part, so that the surface of the circuit is caused to be flat, thereby forming a first circuit layer. Thereafter, a second circuit layer is formed on the first circuit layer in the same manner as the above. Therefore, if the multilayer circuits are formed by the conventional method, the productivity considerably decreases.

The superconductive material exhibits a superconductive phenomenon on cooling to a very low temperature, which is less than the critical temperature (hereinafter called Tc), and an electrical resistance becomes zero, thereby a large amount of current can flow. The application of the superconductive material to the electronic equipments has been widely studied. Particularly, oxide superconductive materials such as Y-Ba-Cu-O system and Bi-Sr-Ca-Cu-O system, which exhibit the superconductive phenomenon near the temperature of liquid nitrogen, has been recently found out, and the practical use of the oxide superconductive materials has been widely made. In accordance with this situation, the development of the multilayer circuits using oxide superconductive materials has been actively made.

However, regarding the above-mentioned superconductive materials, particularly oxide superconductive materials, Tc and a critical current density (hereinafter called Jc) considerably change by a slight difference in a composition or a difference in a crystal orientation. Due to this, to apply the oxide superconductive material to the multilayer circuit, the development of the manufacturing method having the above-mentioned features are required.

SUMMARY OF THE INVENTION

An object of the present invention is to provide a superconductive circuit having a high Jc value.

Also, another object of the present invention is to provide a method for effectively manufacturing a superconductive circuit having a high Jc value.

The above object can be attained by a superconductive multilayer circuit comprising a substrate; a first circuit layer formed on the substrate, having a circuit part formed of a superconductive material and a non-circuit part formed of a simulant of the superconductive material; and at least one second circuit layer formed on the first circuit layer, having a circuit part formed of a superconductive material and a non-circuit part formed of a simulant of the superconductive material.

Also, the above object can be attained by a method for manufacturing a superconductive multilayer circuit comprising a first thin film forming step for forming a thin film, which comprises a superconductive material or a similar material thereto, on a substrate; a first circuit layer forming step for forming a superconductive circuit by removing a specific component from a predetermined part of the thin film or implanting the component in a predetermined part of the thin film; a second thin film forming step for forming a thin film, which comprises a superconductive material or the simulant thereto, on the first circuit layer; and a second circuit layer forming step for forming a superconductive circuit by removing a specific component from a predetermined part of the thin film or implanting the component in a predetermined part of the thin film.

Additionally, a superconductive multilayer circuit having three layers or more can be obtained by repeating the second thin film forming step and the second circuit layer forming step a plurality of times.

Additional objects and advantages of the invention will be set forth in the description which follows, and in part will be obvious from the description, or may be learned by practice of the invention. The objects and advantages of the invention may be realized and obtained by means of the instrumentalities and combinations.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

In the present invention, oxide superconductive materials such as the Y-Ba-Cu-O system and the Bi-Sr-Ca-Cu-O system can be used as superconductive materials. Moreover, a simulant of the superconductive material is a material having the same crystal structure as the superconductive material, and lacking in a part of the constituent elements, or containing the constituent elements excessively. Or, the simulant of the superconductive material is a material having the same crystal structure as the superconductive material and containing elements other than the constituent elements. Additionally, the simulant of superconductive material is a material having a low Tc as compared with the superconductive material or being non-conductive at a working temperature. For example, a simulant of the oxide superconductive material of the Y-Ba-Cu-O system is a material in which specific components such as N, B, Ga, Co, Ni, Fe, Zn, Cd, Be are implanted into the superconductive material having a composition of $YBa_2Cu_3O_7$ and Tc=85 to 95K, and heated as required so that Tc is lowered below 77K.

According to the present invention, as a substrate forming the superconductive material or the simulant, there may be used metals which are non-reactive with the superconductive materials such as Cu, Ni, Fe, Co, Cr, Ag, Au, Pt, Mo, Pb, alloys of these metals such as stainless steel, Cu-Ni alloy, Fe-Ni alloy, Fe-Ni-Co alloy, Ni-Cr-Fe alloy, Ag-Ni alloy, Cu-Fe alloy, or ceramics such as $Al_2O_3$, $SiO_2$, $ZrO_2$, stabilized $ZrO_2$, $ThO_2$, AlN, $Si_3N_4$, SiC, $TiO_2$, TiN, MgO, $BaZrO_3$, $KTaO_3$, $FeAlO_4$, or $BaTiO_3$.

Particularly, if a substrate having a crystal conformity to the superconductivity material is selected, the orientation of the surface of the film formed of the superconductive material is oriented in a predetermined orientation on the substrate, thereby the formation of the film can be made.

According to the present invention, as a method for filming the substrate with the superconductive material or the simulant, a vapor phase analyzing method such as a normal sputtering method, a vacuum deposition method, and a CVD method is used.

As a method for forming a circuit in the superconductive film or the simulant formed on the substrate, a photolithography is normally used, but a method for locally irradiating a focus ion beam can be used.

The present invention will be explained with reference to the drawings based on the manufacturing method.

FIGS. 1A to 1E are cross sectional views showing a substrate of the circuit of each step of one embodiment of the present invention.

Figure 1A:
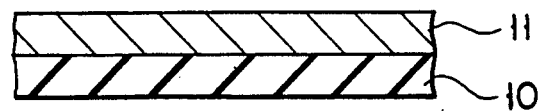
FIGS. 1A, 1B, 1C, 1D and 1E are cross sectional views of the circuit substrate in each step of one embodiment of the present invention.
Figure 1B:
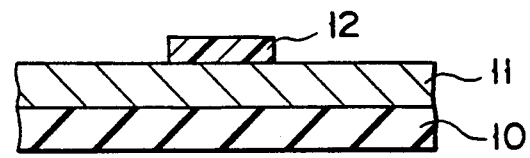
Figure 1C:
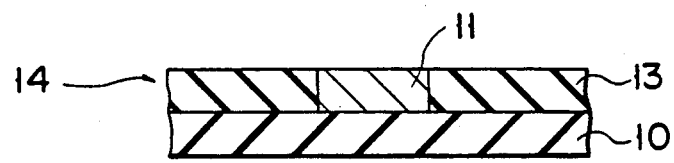

First, as shown in FIG. 1A a superconductive film 11 may be formed on a substrate 10, having a thickness of 0.1 to 10 μ by a physical vapor deposition (PVD) or sputtering. Then, as shown in FIG. 1B, a resist film 12, which serves as a mask having a specific component due to an ion beam, is formed on a predetermined part of a circuit on the superconductive film 11. In this case, a photosensitive resin having a base of polymethyl methacrylate (PMMA) may be used as a resist material. Moreover, a Zn ion beam is irradiated on a non-circuit part of the first superconductive film 11, i.e., an exposed portion where no resist film 12 is formed, thereby a specific component is implanted therein and the resist film 12 is removed. Then, a heating process is performed as required, and the non-circuit part formed of the superconductive film 11 is denatured to a simulant 13 of the superconductive material (hereinafter called simulant) having a Tc lower than the superconductive material In this manner, as shown in FIG. 1C, a first circuit layer 14 having a flat surface is formed.

Figure 1D:
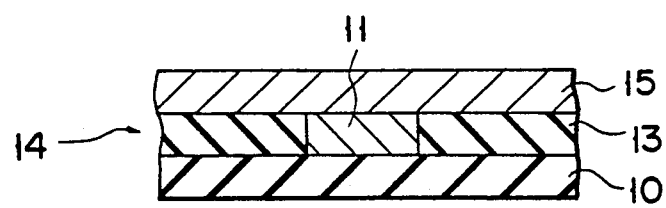
Figure 1E:
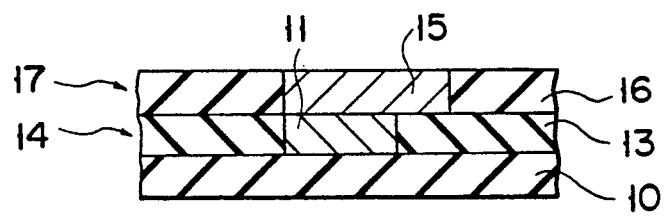

Next, as shown in FIG. 1D, a second superconductive film 15 is further formed on the first circuit layer 14 in the same manner as the first superconductive film 11. Thereafter, as shown in FIG. 1E, a non-circuit part is denatured to a simulant 16 in the same manner as the first circuit layer 14, so that a second circuit layer 17 is formed. In this case, the specific component is implanted in the non-circuit part by the ion beam and the like to denature the superconductive films 11 and 15 to the simulant 13 and 16, respectively. However, it is possible to irradiate a heat ray, hot air, laser a beam and the like on the non-circuit parts of the superconductive films 11 and 15, and disassociate and discharge oxygen in the superconductive film. Additionally, in this case, the temperature in disassociating and discharging oxygen is 700° C. or more in the air. However, the temperature is 200° to 300° C. if it is in the vacuum. The above-mentioned operations are repeated, thereby a multilayer circuit having three or more layers can be formed.

FIGS. 2A to 2E are cross sectional views showing a substrate of the circuit of each step of another embodiment of the present invention.

Figure 2A:
FIGS. 2A, 2B, 2C, 2D and 2E are cross sectional views of the circuit substrate in each step of another embodiment of the present invention.
Figure 2B:
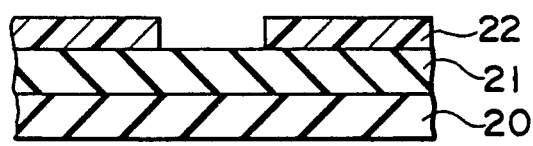
Figure 2C:
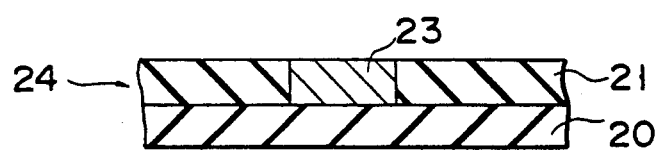

First, as shown in FIG. 2A, a first simulant layer 21 having a thickness of 0.1 to 10 μm, in which an amount of oxygen atoms are reduced, i.e., the so called a state of oxygen deficiency, is formed on a substrate 20 by PVD or sputtering. Next, as shown in FIG. 2B, a resist film 22, which serves as a mask in which a specific component is implanted in a part other than a predetermined part of a circuit, is formed on the first simulant layer 21. Then, the ion beam of oxygen ion is irradiated on the circuit part of the first simulant film 21, i.e., the exposed portion where no resist film 22 is formed, and the oxygen ion is implanted thereon. Thereafter, the resist film 22 is removed. Thereby, as shown in FIG. 2C, the simulant film 21 of the circuit part is denatured to a superconductive material 23, and a first circuit layer 24 having a flat surface is formed.

Figure 2D:
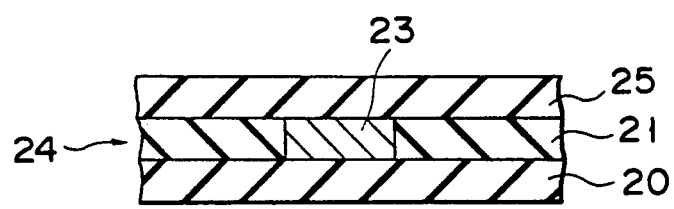
Figure 2E:
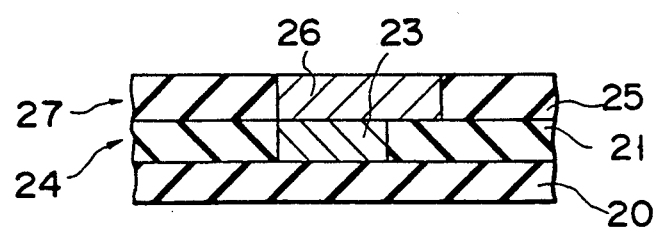

As shown in FIG. 2D, a second simulant film 25, which comprises a material having a Tc lower than the superconductive material or a non-conductive material at a working temperature, is formed on the first circuit layer 24 in the same manner as the first simulant layer 21. Thereafter, as shown in FIG. 2E, similar to the first circuit layer 24, the circuit part is denatured to a superconductive material 26, and a second circuit layer 27 is formed. These operations are repeated, thereby a multilayer circuit having three or more layers can be formed.

In the above-mentioned embodiment, it is possible to form a buffer layer on the first circuit layer, and form a second circuit layer on the buffer layer. In this case, $SiTiO_3$ can be used as a material of the buffer layer.

Moreover, a mutual transformation between an oxide superconductive material and the simulant is favorably performed by implanting or discharging atoms of oxygen since it is excellent in workability. Specifically, other than the above-mentioned ion-implantation method using an ion beam and the like, there may be used a method in which the simulant or the oxide superconductive material is exposed in the oxygen stream activated by a plasma of a low temperature or in the vacuum and heated at a predetermined temperature, thereby oxygen atoms are replenished or discharged.

Regarding the relationship between the content of the oxygen atoms and the Tc, in the case of or oxide superconductive material of $YBa_2Cu_3O_x$, if x are 7.0, 0.6, and 6.5, Tc are 80K or more, less than 77K and 55K or less, respectively. As mentioned above, the content of the oxygen atoms in the oxide superconductive material slightly changes, the Tc largely changes. Moreover, if an element composing the superconductive material other than oxygen is lacking or excessively implanted, Tc largely changes. Therefore, it is possible to use a simulant which is obtained by lacking the element composing the superconductive material other than oxygen or excessively implanting the element.

In the present invention, a method for forming each circuit layer may be changed for every layer. For example, the first circuit layer may be formed by the method shown in FIGS. 1A to 1E, and the second circuit layer may be formed by the method shown in FIGS. 2A to 2E. Moreover, if at least one circuit layer is formed by the method of the present invention, a conventional etching method may be used in the formation of the other circuit layers.

The oxide superconductive material has a strong crystal anisotropy and a short coherence. Due to this, in the oxide superconductive material, the current easily flows in a specific crystal orientation (direction of a-b surface). However, if the crystal orientation is not fully consistent with a grain boundary, a current trouble occurs because of a weak bond. This is well-known from Report of Japan Institute of Metal, Vol. 26, No. 10, pp. 980 to 984, October 1987 and Report of Japan Institute of Applied Electromagnetics, Vol. 12, No. 5, pp. 564 to 569, May 1988.

In the method for manufacturing a multilayer circuit according to the present invention, the material, which constitutes the non-circuit part and the circuit part, has the same or similar crystal structure and has the same crystal orientation as that of the crystal structure, thereby preventing the above-mentioned current trouble.

If the above is explained with reference to the drawing, the circuit parts 11 and 23 and the non-circuit parts 13 and 21 have the relation to the above-mentioned crystal structure, respectively. Moreover, the circuit parts 15 and 26 of the second circuit layers 17 and 27, respectively which are formed on the first circuit layers 14 and 24, respectively in the similar manner, and the non-circuit parts 16 and 25 are epitaxial-growing. Therefore, the circuit parts 15 and 26 of the the second circuit layer and the circuit parts 11 and 23, respectively of the first circuit layer form a junction having no current trouble, and the crystal orientation is arranged in the direction where current easily flows.

Since the circuit parts and the non-circuit parts of the second circuit layer have the same crystal structure, it goes without saying that the third circuit layer forms the structure in which current easily flows similar to the second circuit layer.

The present invention provides a superconductive multilayer circuit, which can be obtained by forming a thin film, which comprises a superconductive material whose conductivity largely changes if the composition slightly changes and its simulant, on a substrate, implanting a specific component in a predetermined part of the thin film and discharging the component therefrom, and forming the thin film on the circuit parts or the non-circuit parts.

According to the present invention, the implantation of the specific component and the discharge thereof are performed by an ion implanting and discharging method, thereby fine processing can be performed. Moreover, by use of a material having crystal consistency with the superconductive material a the substrate, the crystal orientation of the superconductive material can be arranged in a direction where current easily flows. Furthermore, since a vapor deposition method such as a sputtering method can be used as a method for forming a thin film, each layer can be formed in such a manner that the crystal orientation is arranged in the same direction. Also, unlike the conventional etching method, since a circuit having a flat surface can be obtained, a multilayer circuit can be easily manufactured.

EXAMPLE 1

By a magnetron sputtering method using a composite oxide of $ErBa_{2.1}Cu_{3.3}O_x$ as a target, an epitaxial film having a composition of $ErBa_2Cu_3O_y$ and a thickness of 0.5 $\mu$m was formed on a Mgo substrate (100), which had been heated to 650° C., in order to arrange a surface orientation of a surface including the ab axes in a conductive direction. The magnetron sputtering was performed under the atmosphere of mixed gas of Ar+2-0%$O_2$ and on the condition that the gas pressure was 80 m Torr and the RF output was 100 W.

The MgO substrate having a first film of $ErBa_2Cu_3O_y$ was provided in a furnace, and oxygen gas was introduced into the furnace, and heated in the oxygen stream at 900° C. for 15 minutes. Thereafter, the temperature of the furnace was cooled to 500° C. at a speed of 1.5° C./min and a MgO substrate was taken out of the furnace.

As a result of measuring the content of oxygen atoms and the Tc, which were measured before and after the first film of $ErBa_2Cu_3O_y$ was heated, the content of oxygen atoms was $Y=6.35$ and the Tc was 30K before the heating process and the content of oxygen atoms was $Y=6.88$ and the Tc was 84K after the heating process. In this manner, it was confirmed that the Tc of the first film of $ErBa_2Cu_3O_y$ was the temperature of liquid nitrogen (77K) or more.

Sequentially, a photoresist film was formed on a predetermined part having a width of 50 $\mu$m of the circuit of the first film of $ErBa_2Cu_3O_y$ after the heating process. Then, Zn ion of $0.8 \times 10^{16}$ ion/cm$^2$ was implanted in the non-circuit part, and the photoresist film was removed therefrom. Thereafter, the substrate is heated at 400° C. for 10 minutes and the first film of $ErBa_2Cu_3O_y$ was annealed, and homogenized. In this manner, a first circuit layer was formed. At this time, the Tc of the Zn ion-implanted-part was 38K.

Sequentially, a second film of $ErBa_2Cu_3O_y$ having a thickness of 0.5 $\mu$m was formed on the first circuit layer by a vacuum deposition method. In the vacuum deposition method, Er, Ba, Cu were first put in the different crucibles, respectively and melt in the vacuum of $10^{-4}$ Torr and vapored. Then, the vapored Er, Ba, Cu are ionized by a RF excitation coil, which was arranged between the crucible and the substrate, and oxygen gas was sprayed on the substrate which was heated to 590° C.

Thereafter, similar to the first circuit layer, a second circuit layer was formed on the second film of $ErBa_2Cu_3O_y$ by forming a circuit having a width of 50 $\mu$m. At this time, there are two types of circuits, that is, a conductive circuit, which has a conductivity with the first circuit, and an independent circuit which has no conductivity with the first circuit.

Additionally, the circuit part of the first circuit layer and the non-circuit part thereof were checked by an X-ray diffraction. As a result, the crystal structure of both parts was a rhombic system, and the c axis was arranged to be perpendicular to the surface of the substrate. Also, a lattice constant of the c axis was 11.68A in the circuit part, and 11.70A in the non-circuit part.

Moreover, the circuit part of the second circuit layer was checked by X-ray diffraction. As a result, c axis was arranged to be perpendicular to the surface of the substrate and the lattice constant of the c axis was 11.68A.

EXAMPLE 2

A two-layer circuit having a conductive circuit and an independent circuit was formed in the same manner as Example 1 other than that the thicknesses of first and second films of $ErBa_2Cu_3O_y$ were 0.3 $\mu$m and that the ion implantation is not used in the second circuit layer. Instead of using the ion implantation, a Fe film having a thickness of 0.015 $\mu$m was formed on the non-circuit part of the second $ErBa_2Cu_3Oy$, thereafter heating at 450° C.

Additionally, the circuit part of the first circuit layer and the non-circuit part thereof were checked by X-ray diffraction. As a result, the c axis was arranged to be perpendicular to the surface of the substrate. Also, a lattice constant of the c axis was 11.68A in the circuit part, and 11.73A in the non-circuit part.

Moreover, the circuit part of the second circuit layer was checked by X-ray diffraction. As a result, the c axis was arranged to be perpendicular to the surface of the substrate and the lattice constant of the c axis was 11.68A in the circuit part, and 11.71A in the non-circuit part.

EXAMPLE 3

A first film of $YBa_2Cu_3Oy$ having a thickness of 0.4 μm was formed on the MgO substrate (100) used in Example 1 by the vapor deposition method (degree of vacuum of $0.5 \times 10^{-4}$ Torr). As a result of measuring the content of oxygen atoms of the film of $ErBa_2Cu_3Oy$ and Tc, the content of oxygen atoms was Y=6.4 and Tc was 54K.

Sequentially, a photoresist film was formed on the part other than a predetermined part of the circuit (50 μm of width). Then, an $O_2$ plasma process of the electron cyclotron resonance was performed for 15 minutes as the substrate was heated at 200° C., and oxygen atoms ware incorporated into the predetermined part of the circuit, thereby a first circuit layer was formed.

Sequentially, a second film of $YBa_2Cu_3Oy$ having a thickness of 0.4 μm was formed on the first circuit layer by the vapor deposition method (degree of vacuum of $0.5 \times 10^{-4}$ Torr). Thereafter, a circuit was formed in the same manner as the first circuit layer, thereby a second circuit layer was formed. In this way, a two-layer circuit layer having a conductive circuit and an independent circuit was formed.

Additionally, the circuit part of the first circuit layer and the non-circuit part thereof were checked by X-ray diffraction. As a result, the c axis was oriented to be perpendicular to the surface of the substrate. Also, a lattice constant of the c axis was 11.67A in the circuit part, and 11.73A in the non-circuit part.

Moreover, the circuit part of the second circuit layer and the non-circuit part thereof were checked by X-ray diffraction. As a result, the c axis was oriented to be perpendicular to the surface of the substrate and the lattice constant of the c axis was 11.68A in the circuit part and 11.73A in the non-circuit part.

COMPARED EXAMPLE

A first circuit layer was formed in the same manner as Example 1 other than that a Zn thin film having a thickness of 0.3 μm on a non-circuit part by sputtering in place of implanting Zn ions, thereafter heating at 450° C. for two hours in the air.

The obtained first circuit layer was checked by an X-ray diffraction. As a result, it was confirmed that the peak of $ErBa_2Cu_3Oy$ was small only in the diffraction peak of the circuit part. Also, the peak of ZnO was confirmed in the diffraction peak of the non-circuit part.

Moreover, a second circuit layer was formed on the first circuit layer in the same manner as Example 1.

Regarding each two-layer circuit of the above-mentioned Examples 1 to 3 and Compared Example, the Tc and Jc in the conductive circuit and the independent circuit were measured. Table 1 shows the results together with the main conditions. Additionally, the Jc was measured in liquid nitrogen (77K) by a four terminal method.

As is obvious from Table 1, the superconductive multilayer circuit of the present invention exhibited high Tc and Jc.

According to the Examples, the Tc of the circuit parts are 83 to 85K. In contrast, Tc of the non-circuit parts are low. Specifically, the part where Zn is implanted and the part, which is oxygen deficiency, are 38K and 54K, respectively. Due to this, since these non-circuit parts become insulators at the temperature of, liquid nitrogen, trouble such as a short-circuit does not occur. Also, the Jc of the conductive circuit is lower than that of the independent circuit, but is of a sufficient value for the multilayer circuit. This proves that the first and second circuit layers have the same orientation of surface, and are connected to each other.

In the above Examples, the width of the circuit is 50 μm. However, by the use of the modern technique of lithography in the technical field of the manufacture of the semiconductor, it is possible to form a superconductive multilayer circuit in which the width of the circuit is μm order and a fine pattern is sub μm order.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

TABLE 1

| | super-conductive member | thickness (μm) | first layer film forming method (Torr) | first layer circuit forming method | second layer film forming method (Torr) | second layer circuit forming method | conductive circuit Tc (K) | conductive circuit Jc (A/cm²) | independent circuit Tc (K) | independent circuit Jc (A/cm²) |
|---|---|---|---|---|---|---|---|---|---|---|
| Example 1 | Er system | 0.5 | magnetron sputtering | ion implantation | vacuum-deposition ($10^{-4}$) | ion implantation | 83 | $2.1 \times 10^5$ | 85 | $1.5 \times 10^6$ |
| Example 2 | Er system | 0.3 | magnetron sputtering | ion implantation | vacuum-deposition ($10^{-4}$) | sputtering + diffusion | 84 | $4.2 \times 10^5$ | 84 | $1.1 \times 10^6$ |
| Example 3 | Y system | 0.4 | vacuum deposition ($0.5 \times 10^{-4}$) | plasma heating | vacuum-deposition ($0.5 \times 10^{-4}$) | plasma heating | 83 | $0.9 \times 10^5$ | 84 | $0.9 \times 10^6$ |
| Compered | Er system | 0.5 | magnetron | sputter- | vacuum- | ion | 82 | $2.0 \times$ | 81 | $0.9 \times$ |

TABLE 1-continued

|  |  | first layer | | second layer | | conductive circuit | | independent circuit | |
| --- | --- | --- | --- | --- | --- | --- | --- | --- | --- |
| super-conductive member | thickness ($\mu m$) | film forming method (Torr) | circuit forming method | film forming method (Torr) | circuit forming method | Tc (K) | Jc (A/cm$^2$) | Tc (K) | Jc (A/cm$^2$) |
| Example |  | sputtering | ing + diffusion | deposition ($10^{-4}$) | implantation |  | $10^3$ |  | $10^3$ |

What is claimed is:

1. A method for manufacturing an oxide superconductive multilayer circuit, comprising the steps of:
   (a) forming a first thin film, which comprises a first oxide superconductive material or a simulant thereof, on a substrate having crystal conformity with the first oxide superconductive material or simulant thereof;
   (b) forming a first circuit layer, which constitutes a first oxide superconductive circuit, by denaturing a part of the first thin film; and
   (c) forming a second thin film, which comprises a second oxide superconductive material or a simulant thereof, on the first thin film such that the crystal orientation of the second oxide superconductive material or the simulant thereof conforms with that of the first oxide superconductive material or the simulant thereof; and
   (d) forming a second circuit layer, which constitutes a second oxide superconductive circuit, by denaturing a part of the second thin film to connect the first and second oxide superconductive circuits.

2. The method for manufacturing an oxide superconductive multilayer circuit according to claim 1, wherein the circuit forming step is performed by implanting an ion into a non-circuit part of the thin film comprising the oxide superconductive material.

3. The method for manufacturing an oxide superconductive multilayer circuit according to claim 1, wherein the circuit forming step is performed by discharging a specific atom of a non-circuit part of the thin film comprising the oxide superconductive material.

4. The method for manufacturing an oxide superconductive multilayer circuit according to claim 3, wherein the specific atom is an oxygen atom.

5. The method for manufacturing an oxide superconductive multilayer circuit according to claim 1, wherein the circuit forming step is performed by incorporating a specific atom into the circuit part of the thin film comprising the simulant of the oxide superconductive material.

6. The method for manufacturing an oxide superconductive multilayer circuit according to claim 5, wherein the specific atom is an oxygen atom.

7. The method for manufacturing an oxide superconductive multilayer circuit according to claim 1, wherein the oxide superconductive material is selected from the group consisting of a Y-Ba-Cu-O material and is a Bi-Sr-Ca-Cu-O material.

8. The method for manufacturing an oxide superconductive multilayer circuit according to claim 1, wherein the simulant comprises $YBa_2Cu_3O_7$ and additionally one or more components selected from the group consisting of N, B, Ga, Cu, Ni, Fe, Zn, Cd and Be.

9. The method for manufacturing an oxide superconductive multilayer circuit according to claim 1, wherein the substrate is selected from the group consisting of Cu, Ni, Fe, Co, Cr, Ag, Au, Pt, Mo, Pb, stainless steel, Cu-Ni alloy, Fe-Ni alloy, Fe-Ni-Co alloy, Ni-Cr-Fe alloy, Ag-Ni alloy, Cu-Fe alloy, $Al_2O_3$, $SiO_2$, $ZrO_2$, $ThO_2$, AlN, $Si_3N_4$, SiC, $TiO_2$, TiN, MgO, $BaZrO_3$, $KTaO_3$, $FeAlO_4$ and $BaTiO_3$.

10. The method for manufacturing an oxide superconductive multilayer circuit according to claim 1, wherein forming the circuit layer comprises applying a resist film on a portion of said thin film layer, irradiating the thin film layer on a portion where there is no resist film, implanting a specific component, removing the resist film and heating to denature a part of the thin film to form a simulant of the oxide superconductive material having a Tc lower than the oxide superconductive material.

11. The method for manufacturing an oxide superconductive multilayer circuit according to claim 10, wherein the resist film comprises a photosensitive resin comprising polymethylmethacrylate.

12. The method for manufacturing an oxide superconductive multilayer circuit according to claim 1, wherein the denaturing results in the part of the thin film having a Tc lower than that of the superconductive material.

13. The method for manufacturing an oxide superconductive multilayer circuit according to claim 1, further comprising the step of repeating the second thin film forming-step and the second circuit layer forming step.

* * * * *

UNITED STATES PATENT AND TRADEMARK OFFICE
CERTIFICATE OF CORRECTION

PATENT NO. : 5,194,419

DATED : March 16, 1993

INVENTOR(S) : SHIGA et al

It is certified that error appears in the above-identified patent and that said Letters Patent is hereby corrected as shown below:

Column 10, Claim 8, last line: after "Ga" delete "Cu" and insert --Co--.

Signed and Sealed this

Thirteenth Day of December, 1994

Attest:

BRUCE LEHMAN

Attesting Officer      Commissioner of Patents and Trademarks